United States Patent
Liu et al.

(10) Patent No.: US 12,279,441 B2
(45) Date of Patent: Apr. 15, 2025

(54) INSULATED GATE BIPOLAR TRANSISTOR, POWER MODULE, AND LIVING APPLIANCE

(71) Applicants: Guangdong Midea White Home Appliance Technology Innovation Center Co., Ltd., Foshan (CN); Midea Group Co., Ltd., Foshan (CN)

(72) Inventors: Lishu Liu, Foshan (CN); Yuxiang Feng, Foshan (CN)

(73) Assignees: GUANGDONG MIDEA WHITE HOME APPLIANCE TECHNOLOGY INNOVATION CENTER CO., LTD., Foshan (CN); MIDEA GROUP CO., LTD., Foshan (CN)

( * ) Notice: Subject to any disclaimer, the term of this patent is extended or adjusted under 35 U.S.C. 154(b) by 450 days.

(21) Appl. No.: 17/724,413

(22) Filed: Apr. 19, 2022

(65) Prior Publication Data
US 2022/0238705 A1    Jul. 28, 2022

Related U.S. Application Data

(63) Continuation of application No. PCT/CN2019/125921, filed on Dec. 17, 2019.

(30) Foreign Application Priority Data

Oct. 23, 2019  (CN) .......................... 201911013226.4

(51) Int. Cl.
H10D 12/00    (2025.01)
H10D 62/17    (2025.01)

(52) U.S. Cl.
CPC ......... H10D 12/441 (2025.01); H10D 62/393 (2025.01)

(58) Field of Classification Search
CPC ............. H01L 29/0619; H01L 29/0821; H01L 29/0834; H01L 29/1095; H01L 29/7395;
(Continued)

(56) References Cited

U.S. PATENT DOCUMENTS

2002/0013030 A1*  1/2002  Kawahashi ......... H01L 29/0834
                                                          257/E29.037
2007/0158680 A1*  7/2007  Ozeki ............... H01L 29/66333
                                                          257/163
(Continued)

FOREIGN PATENT DOCUMENTS

CN           1885507 A      12/2006
CN         101127365 A       2/2008
(Continued)

OTHER PUBLICATIONS

International Search Report, International application No. PCT/CN2019/125921, mailed Jul. 24, 2020(11 pages).
(Continued)

*Primary Examiner* — Fazli Erdem
(74) *Attorney, Agent, or Firm* — Morgan, Lewis & Bockius LLP

(57) ABSTRACT

An insulated gate bipolar transistor includes a semiconductor substrate, and the semiconductor substrate includes: a collector region doped in a first type, wherein the collector region includes a bump region; a first drift region doped in a second type and a second drift region doped in the second type; wherein the first drift region and the second drift region locate on a side of the collector region having the bump region, a profile contour of the first drift region matches a profile contour of the bump region, such that the second drift region does not contact the bump region, and a doping concentration of the first drift region is greater than a doping concentration of the second drift region; and a first active
(Continued)

region and a second active region, formed at two opposite ends of the second drift region.

20 Claims, 4 Drawing Sheets

(58) Field of Classification Search
CPC ............ H01L 29/7397; H10D 62/364; H10D 62/393; H10D 12/441; H10D 84/611
USPC ......................................................... 257/139
See application file for complete search history.

(56) References Cited

U.S. PATENT DOCUMENTS

| | | | | |
|---|---|---|---|---|
| 2009/0206365 | A1* | 8/2009 | Tsukuda | ............ H01L 29/0696 257/E29.197 |
| 2011/0042715 | A1* | 2/2011 | Tsukuda | ............ H01L 29/0661 257/E29.197 |
| 2012/0261715 | A1 | 10/2012 | Kim et al. | |

FOREIGN PATENT DOCUMENTS

| | | | |
|---|---|---|---|
| CN | 101849288 | A | 9/2010 |
| CN | 102386220 | A | 3/2012 |
| CN | 102738238 | A | 10/2012 |
| CN | 103681814 | A | 3/2014 |
| CN | 103681817 | A | 3/2014 |
| CN | 103703566 | A | 4/2014 |
| CN | 203644779 | U | 6/2014 |
| CN | 104285298 | A | 1/2015 |
| CN | 104285300 | A | 1/2015 |
| CN | 204424261 | U | 6/2015 |
| CN | 104916575 | A | 9/2015 |
| CN | 105489636 | A | 4/2016 |
| CN | 105489638 | A * | 4/2016 |
| CN | 105789290 | A | 7/2016 |
| CN | 205428937 | U | 8/2016 |
| CN | 107749420 | A | 3/2018 |
| CN | 108231903 | A | 6/2018 |
| IN | 104701355 | A | 6/2015 |
| JP | S 6115370 | A | 1/1986 |
| JP | 2008140828 | A | 6/2008 |
| JP | 2013069871 | A | 4/2013 |

OTHER PUBLICATIONS

Chinese first office action, application No. 201911013226.4, mailed Sep. 4, 2020(16 pages).
Chinese Notification to Grant Patent Right for Invention, application No. 201911013226.4, mailed Feb. 1, 2021(7 pages).
Midea Group Co., Ltd., Extended European Search Report and Supplementary Search Report, EP19950004.2, Sep. 9, 2022, 10 pgs.
Midea Group Co., Ltd., WO, PCT/CN2019/125921, Jul. 24, 2020, 4 pgs.
Midea Group Co., Ltd., IPRP, PCT/CN2019/125921, Apr. 26, 2022, 5 pgs.

* cited by examiner

INSULATED GATE BIPOLAR TRANSISTOR, POWER MODULE, AND LIVING APPLIANCE

CROSS REFERENCE TO RELATED APPLICATIONS

The present application is a continuation application of International (PCT) Patent Application No. PCT/CN2019/125921, filed on Dec. 17, 2019, which claims the priority of Chinese Patent Application No. 201911013226.4, filed on Oct. 23, 2019, in the title of "INSULATED GATE BIPOLAR TRANSISTOR, POWER MODULE, AND LIVING APPLIANCE", in China National Intellectual Property Administration, the entire contents of which are hereby incorporated by reference in their entireties.

TECHNICAL FIELD

The present disclosure relates to the field of power electronics, and in particular to an insulated gate bipolar transistor, a power module and an electrical appliance.

BACKGROUND

An insulated gate bipolar transistor (IGBT) is a power semiconductor device, which consists of a bipolar triode and an insulated gate field effect tube and is a composite all-control device driven by voltages. Since the IGBT has a high input impedance, a low conduction voltage drop, a low driving power and a low voltage drop, the IGBT is widely used in various fields as a new type of power electronic device.

The IGBT is a non-ideal element that has a certain conduction resistance. The higher the conduction resistance, the higher the conduction loss is generated while the IGBT is operating. The conduction resistance includes a conduction resistance of a drift region. Therefore, an improved technical solution is needed to reduce the conduction resistance of the drift region.

SUMMARY OF THE DISCLOSURE

The present disclosure provides an insulated gate bipolar transistor, a power module and an electrical appliance to reduce the conduction resistance of the drift region.

In a first aspect, the present disclosure provides an insulated gate bipolar transistor, including a semiconductor substrate. The semiconductor substrate includes: a collector region doped in a first type, wherein the collector region comprises a bump region; a first drift region doped in a second type and a second drift region doped in the second type; wherein the first drift region and the second drift region locate on a side of the collector region having the bump region, a profile contour of the first drift region matches a profile contour of the bump region, such that the second drift region does not contact the bump region, and a doping concentration of the first drift region is greater than a doping concentration of the second drift region; and a first active region and a second active region, formed at two opposite ends of the second drift region.

In some embodiments, the first drift area covers the bump region, such that the second drift region does not contact the bump region, and the second drift region contacts other portions of the collector region; or the first drift region comprises regions that cover the bump region and a surface of the collector region disposed on two ends of the bump region, such that the second drift region does not contact the collector region.

In some embodiments, each of the first active region and the second active region includes: a first type of well region, formed in the second drift region; and an emission region doped in the second type, formed in the first type of well region.

In some embodiments, the first type of well region includes: a lightly doped region in the first type, formed in the second drift region; a region doped in the first type, formed on a side of the lightly doped region in the first type; wherein the emission region is formed in the region doped in the first type, and at least a portion of the region doped in the first type contacts the second drift region. Alternatively, the first type of well region comprises: a lightly doped region in the first type, formed in the second drift region; and a region doped in the first type, formed in the lightly doped region in the first type; wherein the emission region is formed in the region doped in the first type.

In some embodiments, the transistor further includes: a collector electrode, disposed on a first surface of the semiconductor substrate and contacting the collector region; and a first emitter electrode and a second emitter electrode, disposed on a second surface of the semiconductor substrate opposite to the first surface and contacting the first active region and the second active region, respectively.

In some embodiments, the transistor further includes: a gate insulating layer, disposed on the second surface of the semiconductor substrate and arranged between the first emitter electrode and the second emitter electrode; a gate electrode, disposed on the gate insulating layer, wherein an overlap is present between a projection of the gate electrode in a thickness direction of the semiconductor substrate and a projection of the first type of well region in the thickness direction of the semiconductor substrate. The bump region and the first drift region include portions extending into a gap between the first active region and the second active region.

In some embodiments, the semiconductor substrate further includes a recessed portion, and the recessed portion is configured between the first active region and the second active region. The transistor further includes: a gate insulating layer and a gate electrode, wherein the gate insulating layer and the gate electrode are received in the recessed portion, the gate electrode contacts the gate insulating layer but does not directly contact the semiconductor substrate, and an overlap is present between a projection of the gate electrode in a direction parallel to the first surface F and a projection of the first type of well region in the direction parallel to the first surface F. The bump region is arranged at a position of the collector region corresponding to the first active region and at another position of the collector region corresponding to the second active region.

In some embodiments, in a direction from the second drift region to the collector region, a cross section of the bump region is V-shaped or U-shaped.

In a second aspect, the present disclosure provides a power module, including the insulated gate bipolar transistor according to any one of the above embodiments.

In a third aspect, the present disclosure provides an electrical appliance including the power module according to any one of the above embodiments.

According to the present disclosure, the insulated gate bipolar transistor has a collector region that is doped in a first type. The collector region includes a bump region. The insulated gate bipolar transistor has a drift region that is doped in a second type. The drift region locates on a side of the collector region and includes a first drift region and a second drift region. The first drift region has a higher doping concentration, directly contacts the bump region, and has a profile matching the bump region, such that the second drift region that has a lower doping concentration does not contact the bump region. While the IGBT is conducted, channels in a first active region and a second active region are unblocked. Due to presence of the bumped region, an effective thickness of the drift region is reduced, and electrons (or holes) from the first active region and the second active region and the holes (or electrons) from the collector region may flow through a shorter conduction path, accelerating electron-hole complex, reducing the conduction loss in the drift region, thus reducing an overall conduction loss of the IGBT. Further, since the first active region and the second active region are formed at two ends of the second drift region that has the lower doping concentration, a voltage withstand range of the IGBT is larger and a voltage withstand capability is better.

BRIEF DESCRIPTION OF THE DRAWINGS

In order to more clearly illustrate the technical solutions in the embodiments of the present disclosure, drawings used in the description of the embodiments will be briefly described in the following. Apparently, the drawings in the following description are only some of the embodiments of the present disclosure, and other drawings can be obtained by an ordinary skilled person in the art based on these drawings without any creative work.

DETAILED DESCRIPTION

Technical solutions in the embodiments of the present disclosure will be clearly and completely described by referring to the accompanying drawings in the embodiments of the present disclosure. Apparently, the embodiments described are only a part of, but not all of, the embodiments of the present disclosure. All other embodiments that are obtained by an ordinary skilled person in the art based on the embodiments of the present disclosure without making creative work shall fall within the scope of the present disclosure.

Figure 1:
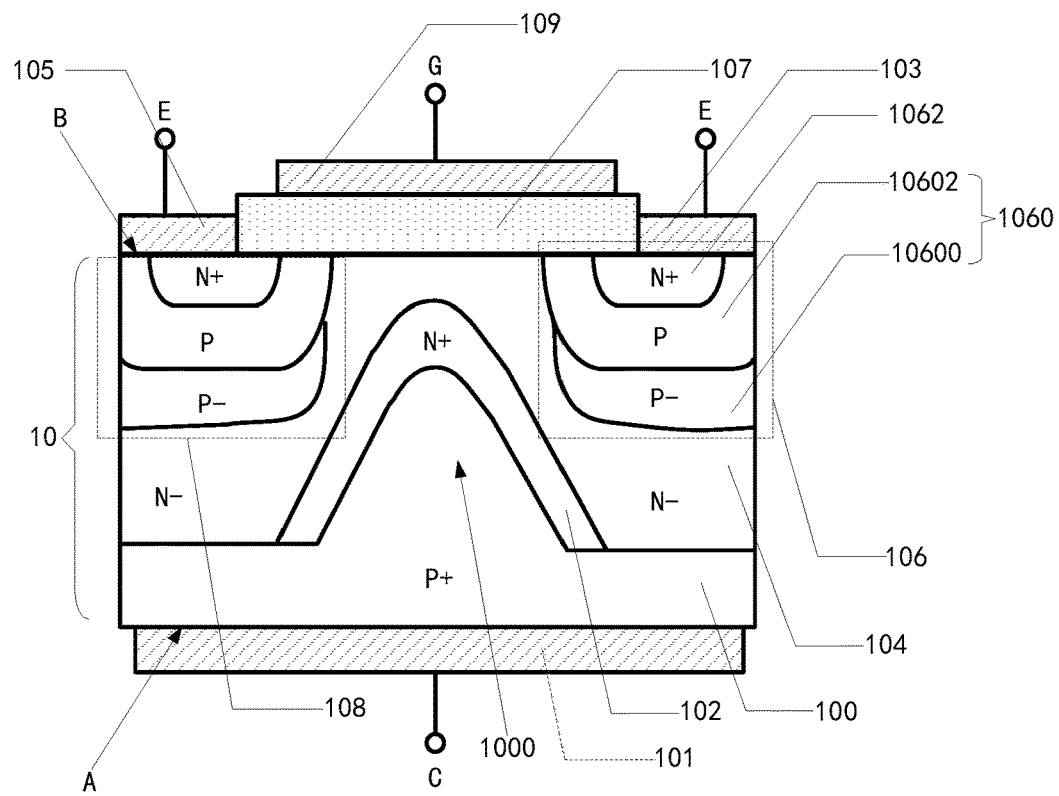
FIG. 1 is a structural schematic view of an IGBT according to some embodiments of the present disclosure.

As shown in FIG. 1, FIG. 1 is a structural schematic view of an IGBT according to some embodiments of the present disclosure. The IGBT includes a semiconductor substrate 10, which may be made of silicon, silicon carbide, germanium, silicon germanium crystals, gallium nitride, gallium arsenide, and so on. The IGBT may be cube-shaped and the like. The semiconductor substrate 10 includes a collector region 100 that is doped in a first type, a first drift region 102 that is doped in a second type, a second drift region 104 that is doped in a second type, a first active region 106, and a second active region 108. In the present embodiments, the first type is a P type, and the second type is an N type. Of course, in other embodiments, the first type may be the N type, and the second type may be the P type. In an actual IGBT preparation process, an ion injection process can be performed to dope a corresponding type of substance in each region and to control a corresponding doping concentration. For example, the doping substance corresponding to the P type may contain boron, and the doping substance corresponding to the N type may contain arsenic or phosphorus.

As shown in FIG. 1, the collector region 100 includes a bump region 1000. The first drift region 102 and the second drift region 104 locate on a side of the collector region 100 that has the bump region 1000. The first drift area 102 has a profile contour that matches a profile contour of the bump region 1000, such that the second drift region 104 does not contact the bump region 1000. The doping concentration of the first drift region 102 is greater than the doping concentration of the second drift region 104. For example, the doping concentration of the first drift region 102 is one or two orders higher than the doping concentration of the second drift region 104. The first active region 106 and the second active region 108 are formed at two opposite ends of the second drift region 104. While the IGBT is being conductive, inner channels in the first active region 106 and the second active region 108 are unblocked. Due to the presence of the bump region 1000, an effective thickness of the drift region is reduced, and electrons (or holes) from the first active region 106 and the second active region 108 and the holes (or electrons) from the collector region 100 may flow through a shorter conduction path, which accelerates electron-hole complex, and reduces a conduction loss of the drift region, such that an overall conduction loss of the IGBT is reduced. Since the first active region 106 and the second active region 108 are formed at the two ends of the second drift region 104 that has the lower doping concentration, a voltage withstand range of the IGBT is larger, and a voltage withstand capability is better.

In an implementation, as shown in FIG. 1, in a direction from the second drift region 104 to the collector region 100, a cross section of the bump region 1000 is V-shaped. A cross section of a portion of the first drift region 102 that covers the bump region 1000 is V-shaped. A tip and sides of the V-shaped cross section may be curved to some extent. In this way, the portion of the first drift region 102 that covers the bump region 1000 is closer to the channels of the first active region 106 and the second active region 108, thereby reducing the effective thickness of the drift region and shortening the conduction path.

Figure 2:
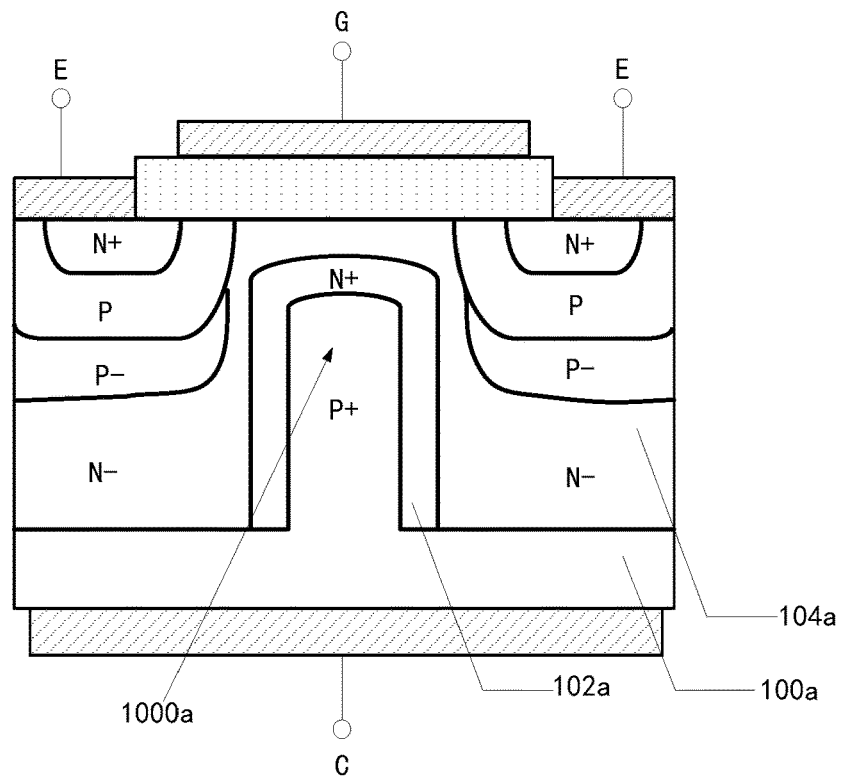
FIG. 2 is a structural schematic view of an IGBT according to other embodiments of the present disclosure.

In other embodiments, as shown in FIG. 2, FIG. 2 is a structural schematic view of an IGBT according to other embodiments of the present disclosure. In a direction from the second drift region 104a to the collector region 100a, the cross section of the bump region 1000a is U-shaped, and the cross section of the portion of the first drift region 102a that covers the bump region 1000a is U-shaped. Such the configuration can also achieve the above technical effect.

In another implementation, as shown in FIG. 1, the first drift region 102 covers the bump region 1000, such that the second drift region 104 does not contact the bump region 1000, and the second drift region 104 contacts other parts of the collector region 100. In this way, a production cost of the IGBT may be low. Further, since the second drift region 104 has a partial region that contacts the collector region 100, carriers in the second drift region 104 may be composited off quickly while the IGBT is being disconnected, improving a disconnection efficiency of the IGBT.

Figure 3:
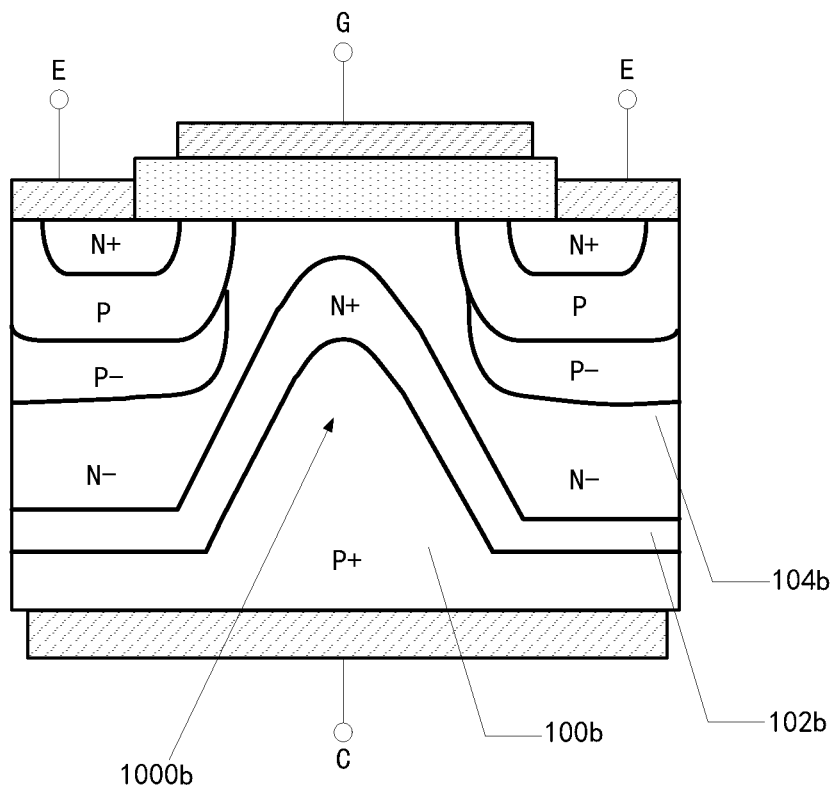
FIG. 3 is a structural schematic view of an IGBT according to other embodiments of the present disclosure.

In other embodiments, as shown in FIG. 3, FIG. 3 is a structural schematic view of an IGBT according to other embodiments of the present disclosure. In the present embodiments, the first drift region 102*b* covers surfaces of the bump region 1000*b* and the collector regions 100*b* located on two sides of the bump region 1000*b*, such that the second drift region 102*b* does not contact the collector region 100*b*. The IGBT in such the configuration has characteristics of a field cutoff type of IGBT, i.e., in the above configuration, the first drift region 102*b*, which has the high doping concentration and locates between the collector region 100*b* locating on the two sides of the bump region 1000*b* and the second drift region 104*b* with the low doping concentration, enables the electric field to attenuate rapidly. In this way, the electric field may be cut off in the first drift region 102*b*, and a depletion zone may be prevented from extending to the collector region 100*b* and leading to penetration. Further, the thickness of the IGBT may be reduced significantly, and the smaller thickness may indicate that the conduction voltage drop and the conduction loss are smaller.

In other embodiments, as shown in FIG. 1, each of the first active region 106 and the second active region 108 mentioned in the above includes: a first type of well region 1060, formed in the second drift region 104; and an emission region 1062 that is doped in the second type and is formed in the first type of well region 1060. The first active region 106 and second active region 108 as mentioned in the above have simple structures and may be achieved by performing an easy process.

In an application scenario, as shown in FIG. 1, the first type of well region 1060 includes: a lightly doped region 10600 in the first type, formed in the second drift region 104; a doped region 10602 in the first type, formed on a side of the lightly doped region 10600 in the first type. The emission region 1062 is formed in doped region 10602 in the first type, and at least a portion of the doped region 10602 in the first type contacts the second drift region 104. In the present embodiments, the doping concentration of the doped region 10602 in the first type may be one or two orders of magnitude higher than the doping concentration of the lightly doped region 10600 in the first type. The doping concentration as mentioned in the above may be achieved performing an easy process. When the lightly doped region 10600 in the first type as mentioned in the above contacts the second drift region 104 that is lightly doped in the second type, a wide depletion zone may be formed between the two regions, such that the IGBT may not be easily broken through, i.e., a plurality of PN junctions are arranged in series, ensuring that the IGBT has the high voltage withstand capability.

Figure 4:
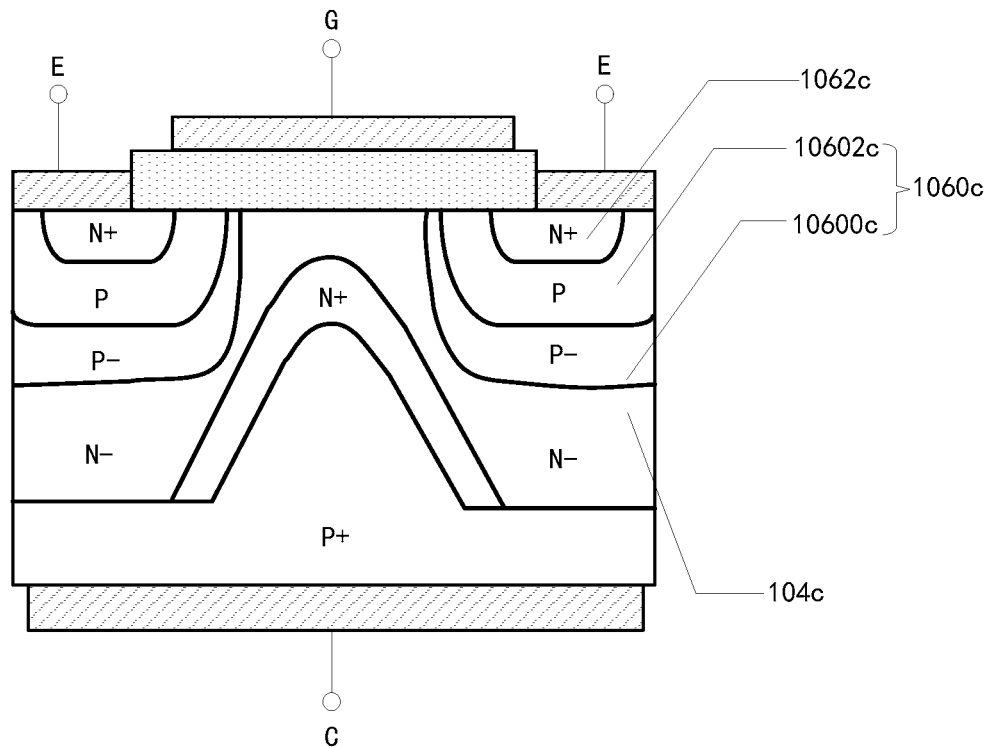
FIG. 4 is a structural schematic view of an IGBT according to other embodiments of the present disclosure.

In another application scenario, as shown in FIG. 4, FIG. 4 is a structural schematic view of an IGBT according to other embodiments of the present disclosure. The first type of well region 1060*c* may have other structures. For example, the first type of well region 1060*c* includes: a lightly doped region 10600*c* in the first type, formed in the second drift region 104*c*; a region 10602*c* doped in the first type, formed in the lightly doped region 10600*c* in the first type, i.e., a side of the region 10602*c* doped in the first type facing the second drift region 104*c* is entirely covered by the lightly doped region 10600*c* in the first type. The emission region 1062*c* is formed in the region 10602*c* doped in the first type. In the present embodiments, the doping concentration of the region 10602*c* doped in the first type may be one or two orders of magnitude higher than that of the lightly doped region 10600*c* in the first type, and the doping concentrations may be achieved by performing an easy process. When the lightly doped region 10600*c* in the first type as mentioned in the above contacts the second drift region 104*c* that is lightly doped in the second type, a wide depletion zone can be formed there between, such that the IGBT may not be easily broken through, i.e., a plurality of PN junctions are arranged in series, ensuring that the IGBT has the high voltage withstand capability.

In another implementation, as shown in FIG. 1, the IGBT provided in the present disclosure further includes: a collector electrode 101, disposed on a first surface A of the semiconductor substrate 10 and contacting the collector region 100; a first emitter electrode 103 and a second emitter electrode 105, disposed on a second surface B of the semiconductor substrate 10 opposite to the first surface A. The first emitter electrode 103 and the second emitter electrode 105 contact the first active region 106 and the second active region 108, respectively. The above-mentioned collector electrode 101, the first emitter electrode 103 and the second emitter electrode 105 may be metal. The above-mentioned collector electrode 101, the first emitter electrode 103 and the second emitter electrode 105 may be arranged in a relatively simple manner and may be achieved by performing an easy process.

Further, as shown in FIG. 1, the IGBT provided in the present disclosure further includes: a gate insulating layer 107, which may be made of silicon dioxide and the like, disposed on the second surface B of the semiconductor substrate 10, and arranged between the first emitter electrode 103 and the second emitter electrode 105; a gate electrode 109, disposed on the gate insulating layer 107. There is an overlap between a projection of the gate electrode 109 along a thickness direction of the semiconductor substrate 10 and a projection of the first type of well region 1060 along the thickness direction of the semiconductor substrate 10. The IGBT in the above is a planar gate, which has a lower saturation current and a better short-circuit capability.

In this case, the bump region 1000 of the collector region 100 and the first drift region 102 may include a portion extending into a gap between the first active area 106 and the second active area 108, such that the first drift region 102 is as close as possible to the channels of the first active area 106 and the second active area 108. In this way, the electrons (or holes) from the emission region 1062 and the holes (or electrons) from the collector region 100 may flow through a shorter conduction path, accelerating the electron-hole complex, reducing the conduction loss in the drift region, and thus reducing the overall conduction loss of the IGBT.

Figure 5:
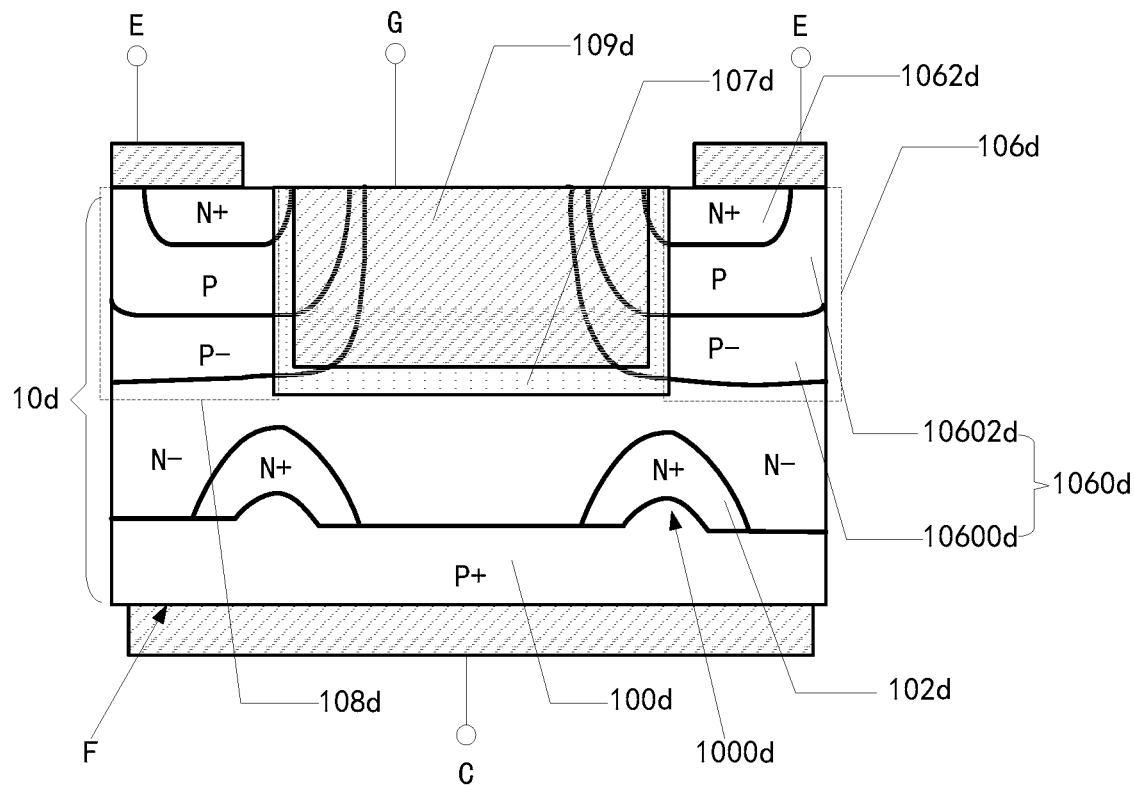
FIG. 5 is a structural schematic view of an IGBT according to other embodiments of the present disclosure.

In other embodiments, as shown in FIG. 5, FIG. 5 is a structural schematic view of an IGBT according to other embodiments of the present disclosure. The semiconductor substrate 10*d* further includes a recessed portion (not shown). The recessed portion is disposed between the first active region 106*d* and the second active region 108*d*. The IGBT further includes: a gate insulating layer 107*d* and a gate electrode 109*d*. The gate insulating layer 107*d* and the gate electrode 109*d* are received in the recessed portion. The gate electrode 109*d* contacts the gate insulating layer 107*d* instead of directly contacting the semiconductor substrate 10*d*. There is an overlap between a projection of the gate electrode 109*d* in a direction parallel to the first surface F and a projection of the first type of well region 1060*d* in a direction parallel to the first surface F. The IGBT having the above structure may be gate-typed, which reduces or even eliminates a JFET (junction field effect tube) region resistance, such that the entire IGBT has a lower conduction resistance. Further, a feature size of the IGBT in the gate type may be made small to improve a power density of the IGBT.

In this situation, the collector region 100d may be arranged with two bump regions 1000d. One of the two bump regions 1000d is arranged at a position corresponding to the first active region 106d, and the other of the two bump regions 1000d is arranged at a position corresponding to the second active region 108d. In this way, the first drift region 102d covering the bump region 1000d may be disposed as close as possible to the channels of the first active region 106d and the second active region 108d, such that the electrons (or holes) from the emission region 1062d and the holes (or electrons) from the collector region 100d may flow through a shorter conduction path, accelerating the electron-hole complex, reducing the conduction loss in the drift region, and thus reducing the overall conduction loss of the IGBT.

Figure 6:
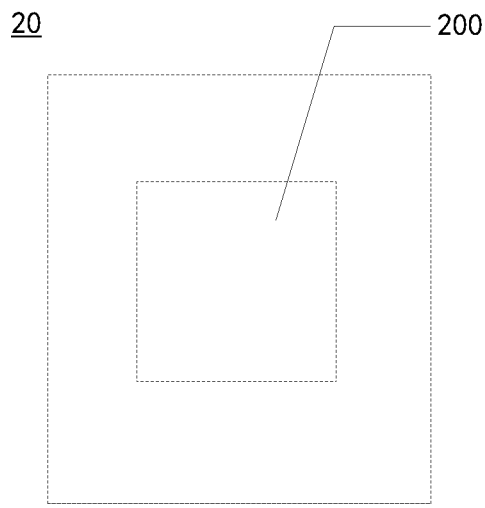
FIG. 6 is a structural schematic view of a power module according to some embodiments of the present disclosure.

As shown in FIG. 6, FIG. 6 is a structural schematic view of a power module according to some embodiments of the present disclosure. The power module 20 includes the IGBT 200 in any of the above embodiments, and the specific structure of the IGBT will not be repeated here. The number of IGBTs 200 in the power module may be more than one, such as 4, 6, and so on, which will not be limited by the present disclosure.

Figure 7:
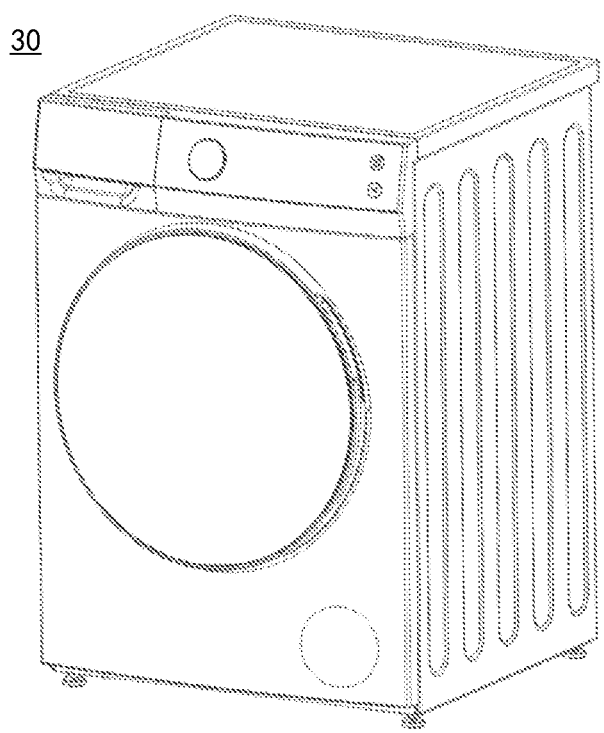
FIG. 7 is a structural schematic view of an electrical appliance according to some embodiments of the present disclosure.

As shown in FIG. 7, FIG. 7 is a structural schematic view of an electrical appliance according to some embodiments of the present disclosure. The electrical appliance 30 may be a washing machine (as shown in FIG. 7), an air conditioner, and the like. A control circuit of the electrical appliance 30 may be provided with the above power module (not shown).

The above is only an implementation of the present disclosure, but does not limit the scope of the present disclosure. Any equivalent structure or equivalent process transformation made based on the specification and the accompanying drawings of the present disclosure, applied directly or indirectly in other related technical fields, shall be included in the scope of the present disclosure.

What is claimed is:

1. An insulated gate bipolar transistor, comprising a semiconductor substrate, the semiconductor substrate comprising:
   a collector region doped in a first type, wherein the collector region comprises a bump region;
   a first drift region doped in a second type and a second drift region doped in the second type, wherein the first drift region and the second drift region are located on a side of the collector region having the bump region, a profile contour of the first drift region matches a profile contour of the bump region, such that the second drift region does not contact the bump region, and a doping concentration of the first drift region is greater than a doping concentration of the second drift region; and
   a first active region and a second active region, formed at two opposite ends of the second drift region, wherein each of the first active region and the second active region comprises:
      a first type of well region, formed in the second drift region; and
      an emission region doped in the second type, formed in the first type of well region; and wherein a portion of the bump region extends into a gap between the first active region and the second active region.

2. The insulated gate bipolar transistor according to claim 1, wherein:
   the first drift region covers the bump region, such that the second drift region does not contact the bump region, and the second drift region contacts other portions of the collector region; or
   the first drift region comprises regions that cover the bump region and a surface of the collector region disposed on two ends of the bump region, such that the second drift region does not contact the collector region.

3. The insulated gate bipolar transistor according to claim 1,
   wherein the first type of well region comprises: a lightly doped region in the first type, formed in the second drift region; a region doped in the first type, formed on a side of the lightly doped region in the first type; wherein the emission region is formed in the region doped in the first type, and at least a portion of the region doped in the first type contacts the second drift region; or
   the first type of well region comprises: a lightly doped region in the first type, formed in the second drift region; and a region doped in the first type, formed in the lightly doped region in the first type; wherein the emission region is formed in the region doped in the first type.

4. The insulated gate bipolar transistor according to claim 1, further comprising:
   a collector electrode, disposed on a first surface of the semiconductor substrate and contacting the collector region; and
   a first emitter electrode and a second emitter electrode, disposed on a second surface of the semiconductor substrate opposite to the first surface and contacting the first active region and the second active region, respectively.

5. The insulated gate bipolar transistor according to claim 4, further comprising:
   a gate insulating layer, disposed on the second surface of the semiconductor substrate and arranged between the first emitter electrode and the second emitter electrode; and
   a gate electrode, disposed on the gate insulating layer, wherein an overlap is present between a projection of the gate electrode in a thickness direction of the semiconductor substrate and a projection of the first type of well region in the thickness direction of the semiconductor substrate.

6. The insulated gate bipolar transistor according to claim 4, wherein:
   the semiconductor substrate further comprises a recessed portion, and the recessed portion is configured between the first active region and the second active region;
   the insulated gate bipolar transistor further comprises a gate insulating layer and a gate electrode, wherein the gate insulating layer and the gate electrode are received in the recessed portion, the gate electrode contacts the gate insulating layer but does not directly contact the semiconductor substrate, and an overlap is present between a projection of the gate electrode in a direction parallel to the first surface and a projection of the first type of well region in the direction parallel to the first surface; and
   the bump region is arranged at a position of the collector region corresponding to the first active region and at another position of the collector region corresponding to the second active region.

7. The insulated gate bipolar transistor according to claim 1, wherein:
in a direction from the second drift region to the collector region, a cross-section of the bump region is V-shaped or U-shaped.

8. A power module, comprising an insulated gate bipolar transistor, wherein the insulated gate bipolar transistor comprises a semiconductor substrate, and the semiconductor substrate comprises:
a collector region doped in a first type, wherein the collector region comprises a bump region;
a first drift region doped in a second type and a second drift region doped in the second type, wherein the first drift region and the second drift region are located on a side of the collector region having the bump region, a profile contour of the first drift region matches a profile contour of the bump region, such that the second drift region does not contact the bump region, and a doping concentration of the first drift region is greater than a doping concentration of the second drift region; and
a first active region and a second active region, formed at two opposite ends of the second drift region, wherein each of the first active region and the second active region comprises:
a first type of well region, formed in the second drift region; and
an emission region doped in the second type, formed in the first type of well region; and wherein a portion of the bump region extends vertically into a gap between the first active region and the second active region.

9. The power module according to claim 8, wherein:
the first drift region covers the bump region, such that the second drift region does not contact the bump region, and the second drift region contacts other portions of the collector region; or
the first drift region comprises regions that cover the bump region and a surface of the collector region disposed on two ends of the bump region, such that the second drift region does not contact the collector region.

10. The power module according to claim 8, wherein each of the first active region and the second active region comprises:
a first type of well region, formed in the second drift region; and
an emission region doped in the second type, formed in the first type of well region.

11. The power module according to claim 10, wherein the first type of well region comprises: a lightly doped region in the first type, formed in the second drift region; a region doped in the first type, formed on a side of the lightly doped region in the first type; wherein the emission region is formed in the region doped in the first type, and at least a portion of the region doped in the first type contacts the second drift region; or
the first type of well region comprises: a lightly doped region in the first type, formed in the second drift region; and a region doped in the first type, formed in the lightly doped region in the first type; wherein the emission region is formed in the region doped in the first type.

12. The power module according to claim 10, wherein the insulated gate bipolar transistor further comprises:
a collector electrode, disposed on a first surface of the semiconductor substrate and contacting the collector region; and
a first emitter electrode and a second emitter electrode, disposed on a second surface of the semiconductor substrate opposite to the first surface and contacting the first active region and the second active region, respectively.

13. The power module according to claim 12, wherein the insulated gate bipolar transistor further comprises:
a gate insulating layer, disposed on the second surface of the semiconductor substrate and arranged between the first emitter electrode and the second emitter electrode; and
a gate electrode, disposed on the gate insulating layer, wherein an overlap is present between a projection of the gate electrode in a thickness direction of the semiconductor substrate and a projection of the first type of well region in the thickness direction of the semiconductor substrate.

14. The power module according to claim 12, wherein:
the semiconductor substrate further comprises a recessed portion, and the recessed portion is configured between the first active region and the second active region;
the insulated gate bipolar transistor further comprises a gate insulating layer and a gate electrode, wherein the gate insulating layer and the gate electrode are received in the recessed portion, the gate electrode contacts the gate insulating layer but does not directly contact the semiconductor substrate, and an overlap is present between a projection of the gate electrode in a direction parallel to the first surface and a projection of the first type of well region in the direction parallel to the first surface; and
the bump region is arranged at a position of the collector region corresponding to the first active region and at another position of the collector region corresponding to the second active region.

15. The power module according to claim 8, wherein:
in a direction from the second drift region to the collector region, a cross-section of the bump region is V-shaped or U-shaped.

16. An electrical appliance, comprising a power module, wherein the power module comprises an insulated gate bipolar transistor, the insulated gate bipolar transistor comprises a semiconductor substrate, and the semiconductor substrate comprises:
a collector region doped in a first type, wherein the collector region comprises a bump region;
a first drift region doped in a second type and a second drift region doped in the second type, wherein the first drift region and the second drift region are located on a side of the collector region having the bump region, a profile contour of the first drift region matches a profile contour of the bump region, such that the second drift region does not contact the bump region, and a doping concentration of the first drift region is greater than a doping concentration of the second drift region; and
a first active region and a second active region, formed at two opposite ends of the second drift region, wherein each of the first active region and the second active region comprises:
a first type of well region, formed in the second drift region; and an emission region doped in the second type, formed in the first type of well region; and wherein a portion of the bump region extends vertically into a gap between the first active region and the second active region.

17. The electrical appliance according to claim 16, wherein;
the first drift region covers the bump region, such that the second drift region does not contact the bump region, and the second drift region contacts other portions of the collector region; or
the first drift region comprises regions that cover the bump region and a surface of the collector region disposed on two ends of the bump region, such that the second drift region does not contact the collector region.

18. The electrical appliance according to claim 16, wherein each of the first active region and the second active region comprises:
a first type of well region, formed in the second drift region; and
an emission region doped in the second type, formed in the first type of well region.

19. The electrical appliance according to claim 18, wherein the first type of well region comprises: a lightly doped region in the first type, formed in the second drift region; a region doped in the first type, formed on a side of the lightly doped region in the first type; wherein the emission region is formed in the region doped in the first type, and at least a portion of the region doped in the first type contacts the second drift region; or
the first type of well region comprises: a lightly doped region in the first type, formed in the second drift region; and a region doped in the first type, formed in the lightly doped region in the first type; wherein the emission region is formed in the region doped in the first type.

20. The insulated gate bipolar transistor of claim 1, wherein the portion of the bump region extends vertically into the gap between the first active region and the second active region, and reduces a distance between the first drift region and the first active region.

* * * * *